United States Patent
Sung et al.

(10) Patent No.: US 10,158,016 B2
(45) Date of Patent: Dec. 18, 2018

(54) MOS DEVICES WITH NON-UNIFORM P-TYPE IMPURITY PROFILE

(71) Applicant: Taiwan Semiconductor Manufacturing Company, Ltd., Hsinchu (TW)

(72) Inventors: Hsueh-Chang Sung, Zhubei (TW); Tsz-Mei Kwok, Hsinchu (TW); Kun-Mu Li, Zhudong Township (TW); Tze-Liang Lee, Hsinchu (TW); Chii-Horng Li, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/450,265

(22) Filed: Mar. 6, 2017

(65) Prior Publication Data

US 2017/0179287 A1 Jun. 22, 2017

Related U.S. Application Data

(62) Division of application No. 13/943,517, filed on Jul. 16, 2013, now Pat. No. 9,601,619.

(51) Int. Cl.
| | |
|---|---|
| *H01L 29/78* | (2006.01) |
| *H01L 21/02* | (2006.01) |
| *H01L 21/8234* | (2006.01) |
| *H01L 27/088* | (2006.01) |
| *H01L 29/08* | (2006.01) |

(Continued)

(52) U.S. Cl.
CPC .... *H01L 29/7848* (2013.01); *H01L 21/02532* (2013.01); *H01L 21/28518* (2013.01); *H01L 21/76843* (2013.01); *H01L 21/76855* (2013.01); *H01L 21/823412* (2013.01); *H01L 21/823418* (2013.01); *H01L 21/823425* (2013.01); *H01L 27/088* (2013.01); *H01L 29/0847* (2013.01); *H01L 29/41758* (2013.01); *H01L 29/41766* (2013.01); *H01L 29/665* (2013.01); *H01L 29/6659* (2013.01); *H01L 29/66545* (2013.01); *H01L 29/66628* (2013.01);

(Continued)

(58) Field of Classification Search
None
See application file for complete search history.

(56) References Cited

U.S. PATENT DOCUMENTS

| | | |
|---|---|---|
| 2006/0138398 A1 | 6/2006 | Shimamune et al. |
| 2007/0235802 A1 | 10/2007 | Chong et al. |

(Continued)

FOREIGN PATENT DOCUMENTS

| | | |
|---|---|---|
| CN | 101925986 A | 12/2010 |
| CN | 102543752 A | 7/2012 |

(Continued)

*Primary Examiner* — Long Pham
(74) *Attorney, Agent, or Firm* — Slater Matsil, LLP

(57) ABSTRACT

An integrated circuit structure include a semiconductor substrate, a gate stack over the semiconductor substrate, and a recess extending into the semiconductor substrate, wherein the recess is adjacent to the gate stack. A silicon germanium region is disposed in the recess, wherein the silicon germanium region has a first p-type impurity concentration. A silicon cap substantially free from germanium is overlying the silicon germanium region. The silicon cap has a second p-type impurity concentration greater than the first p-type impurity concentration.

20 Claims, 6 Drawing Sheets

(51) Int. Cl.
*H01L 29/417* (2006.01)
*H01L 29/66* (2006.01)
*H01L 21/285* (2006.01)
*H01L 21/768* (2006.01)
*H01L 21/8238* (2006.01)

(52) U.S. Cl.
CPC .... *H01L 29/66636* (2013.01); *H01L 29/7834* (2013.01); *H01L 21/823814* (2013.01); *H01L 29/7833* (2013.01)

(56) References Cited

U.S. PATENT DOCUMENTS

| | | |
|---|---|---|
| 2010/0301350 A1 | 12/2010 | Tamura et al. |
| 2011/0117732 A1 | 5/2011 | Bauer et al. |
| 2012/0153350 A1 | 6/2012 | Kronholz et al. |
| 2013/0161751 A1 | 6/2013 | Chung et al. |
| 2013/0316535 A1 | 11/2013 | Shin et al. |

FOREIGN PATENT DOCUMENTS

| | | |
|---|---|---|
| CN | 102790052 A | 11/2012 |
| JP | 5168287 B2 | 3/2013 |
| KR | 20130074353 A | 7/2013 |

MOS DEVICES WITH NON-UNIFORM P-TYPE IMPURITY PROFILE

PRIORITY CLAIM AND CROSS-REFERENCE

This application is a divisional of U.S. patent application Ser. No. 13/943,517, entitled "MOS Devices with Non-Uniform P-type Impurity Profile," filed on Jul. 16, 2013, which application is incorporated herein by reference.

BACKGROUND

Metal-Oxide Semiconductor (MOS) devices are key components of integrated circuits. The performance of MOS devices affects the performance of the entire integrated circuits in which the MOS devices are located. Therefore, methods for improving the performance of the MOS devices have been studied.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Reduction of the size and the inherent features of semiconductor devices (e.g., Metal-Oxide Semiconductor (MOS) devices) has enabled continued improvement in speed, performance, density, and cost per unit function of integrated circuits over the past few decades. In accordance with a design of the MOS devices and one of the inherent characteristics thereof, modulating the length of a channel region underlying a gate between a source and drain of a MOS device alters a resistance associated with the channel region, thereby affecting a performance of the MOS device. More specifically, shortening the length of the channel region reduces a source-to-drain resistance of the MOS device, which, assuming other parameters are maintained relatively constant, may allow an increase in current flow between the source and drain when a sufficient voltage is applied to the gate of the MOS device.

To further enhance the performance of MOS devices, stress may be introduced in the channel region of a MOS device to improve carrier mobility. Generally, it is desirable to induce a tensile stress in the channel region of an n-type MOS ("NMOS") device in a source-to-drain direction, and to induce a compressive stress in the channel region of a p-type MOS ("PMOS") device in a source-to-drain direction.

An available used method for applying compressive stress to the channel regions of PMOS devices is growing SiGe stressors in the source and drain regions. Such a method typically includes the steps of forming a gate stack on a semiconductor substrate, forming spacers on sidewalls of the gate stack, forming recesses in the silicon substrate along gate spacers, epitaxially growing SiGe stressors in the recesses, and annealing. Since SiGe has a lattice constant greater than that of silicon, it expands after annealing and applies a compressive stress to the channel region, which is located between a source SiGe stressor and a drain SiGe stressor.

A process for forming a Metal-Oxide-Semiconductor (MOS) device is provided in accordance with various exemplary embodiments. The intermediate stages of forming the MOS device are illustrated. The variations of the embodiments are discussed. Throughout the various views and illustrative embodiments, like reference numbers are used to designate like elements.

Figure 1:
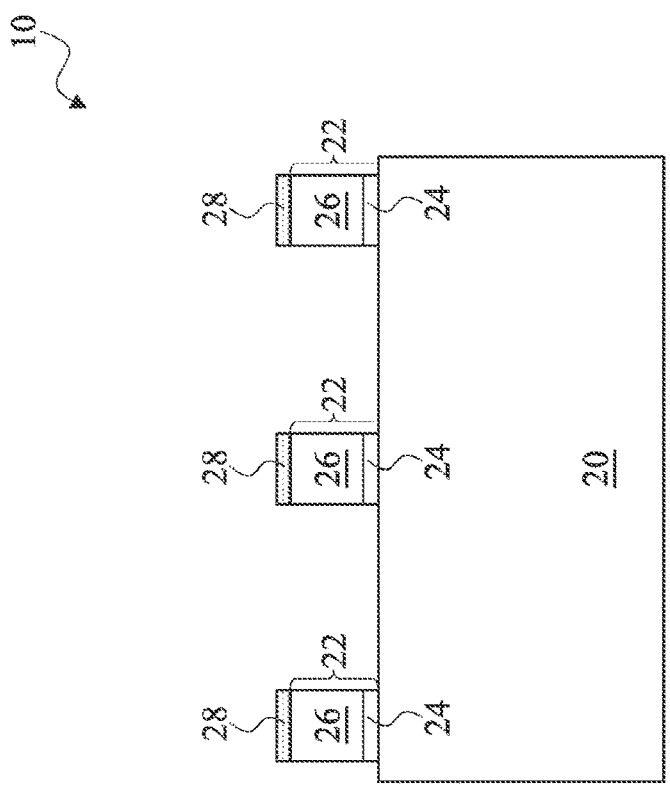

FIG. 1 illustrates substrate 20, which is a portion of wafer 10. Substrate 20 may be a bulk semiconductor substrate such as a silicon substrate, or may have a composite structure, such as a Silicon-On-Insulator (SOI) structure. Alternatively, other semiconductor materials that include group III, group IV, and/or group V elements may also be comprised in substrate 20, which semiconductor materials may include silicon germanium, silicon carbon, and/or III-V compound semiconductor materials.

Gate stacks 22 are formed over substrate 20, and include gate dielectrics 24 and gate electrodes 26. Gate dielectrics 24 may comprise silicon oxide and/or a high-k material having a high k value, for example, higher than about 7. Gate electrodes 26 may include commonly used conductive materials such as doped polysilicon, metals, metal silicides, metal nitrides, and combinations thereof. Gate stacks 22 may also include hard masks 28, which may comprise silicon nitride, for example, although other materials such as silicon carbide, silicon oxynitride, and the like may also be used.

Figure 2:
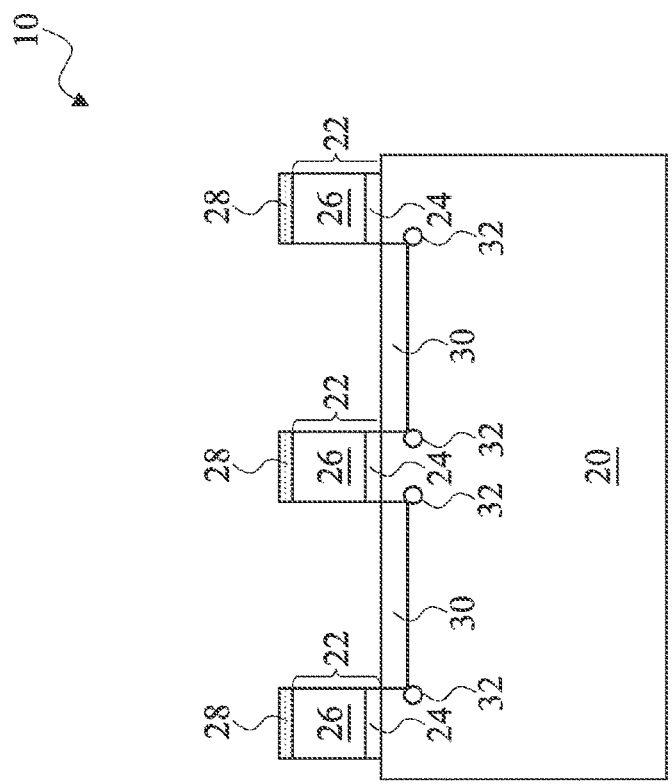
FIGS. 1 through 10 are cross-sectional views of intermediate stages in the manufacturing of a Metal-Oxide Semiconductor (MOS) device in accordance with some exemplary embodiments.

As shown in FIG. 2, Lightly Doped Drain/source (LDD) regions 30 are formed, for example, by implanting a p-type impurity such as boron and/or indium into substrate 20. Gate stacks 22 and hard masks 28 act as implantation masks so that the inner edges of LDD regions 30 are substantially aligned with the edges of gate stacks 22, respectively. The LDD implantation may be performed using energies in a range between about 1 keV and about 10 keV, and a dosage in a range between about $1\times10^{13}/cm^2$ and about $1\times10^{16}/cm^2$. It is appreciated, however, that the values recited throughout the description are merely examples, and may be changed to different values. The LDD implantation may be tilted or vertical, with the tilt angle in a range between about 0 degree and about 30 degrees. In addition, pocket regions 32 may also be formed, for example, by implanting an n-type impurity such as arsenic, phosphorous, or the like into substrate 20. The pocket implantation may be performed using energies in a range between about 20 keV and about 80 keV, and a dosage in a range between about $1\times10^{12}/cm^2$ and about $1\times10^{14}/cm^2$. The pocket implantation may be tilted, with the tilt angle greater than the tilt angle of the LDD implantation. In some embodiments, the tilt angle of the pocket implantation is in a range between about 15 degree and about 45 degrees.

Figure 3:
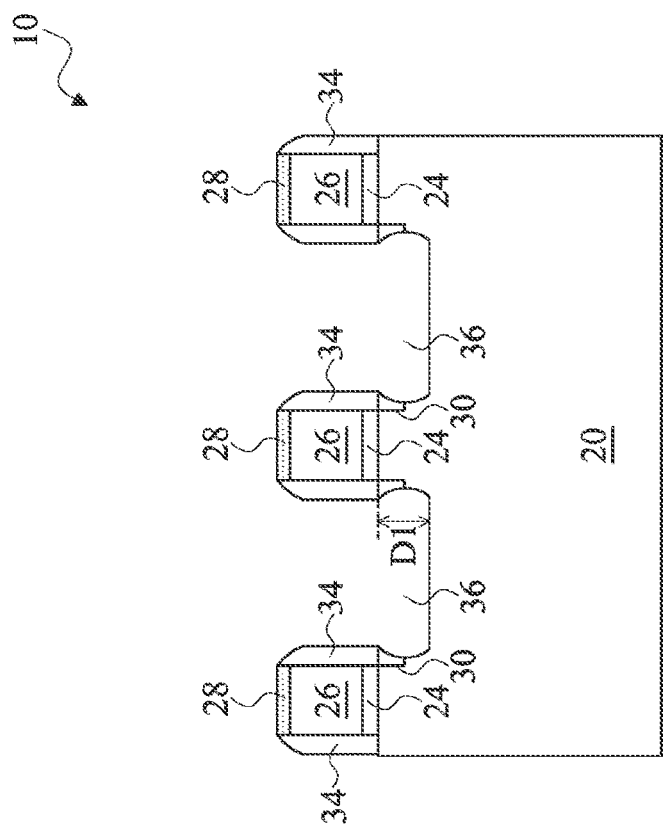

Referring to FIG. 3, gate spacers 34 are formed on the sidewalls of gate dielectrics 24 and gate electrodes 26. In some embodiments, each of gate spacers 34 includes a silicon oxide layer (not shown) and a silicon nitride layer over the silicon oxide layer, wherein the silicon oxide layer may have a thickness in a range between about 15 Å and about 50 Å, and the thickness of the silicon nitride layer may be in a range between about 50 Å and about 200 Å. In alternative embodiments, gate spacers 34 include one or more layers, each comprising silicon oxide, silicon nitride, silicon oxynitride, and/or other dielectric materials. The available formation methods include Plasma Enhanced Chemical Vapor Deposition (PECVD), Low-Pressure Chemical Vapor Deposition (LPCVD), Sub-Atmospheric Chemical Vapor Deposition (SACVD), and other deposition methods.

As also shown in FIG. 3, an isotropic etch is performed to form openings 36 in substrate 20. The isotropic etch may be a dry etch, wherein the etching gas may be selected from $CF_4$, $Cl_2$, $NF_3$, $SF_6$, and combinations thereof. Depth D1 of opening 36 may be in a range between about 150 Å and about 500 Å, for example.

Figure 4:
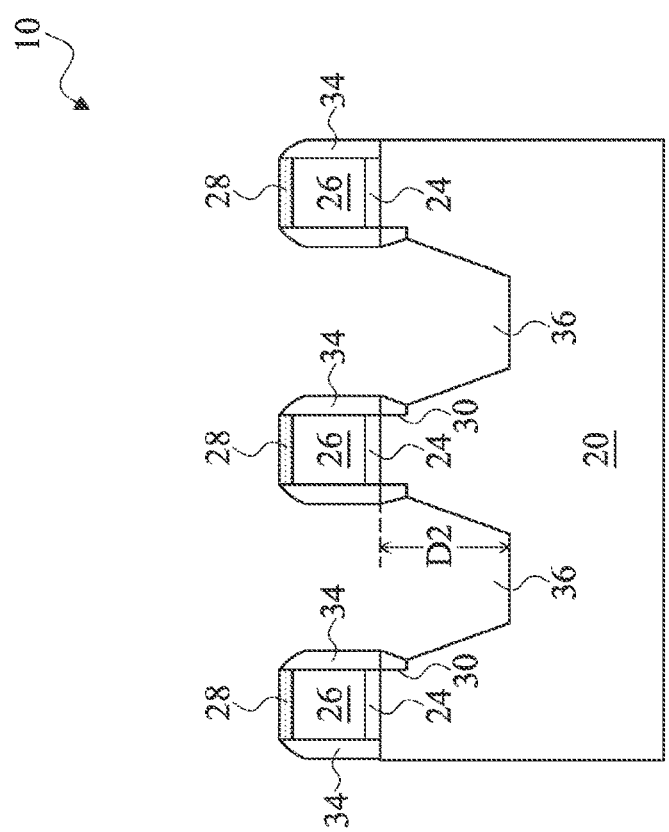

Next, as shown in FIG. 4, a wet etch is performed to expand openings 36. The wet etching may be performed, for example, using Tetra-Methyl Ammonium Hydroxide (TMAH), a potassium hydroxide (KOH) solution, or the like. In some exemplary embodiments, the TMAH solution has a concentration in a range between about 1 percent and about 30 percent. During the wet etch, the temperature of the TMAH may be between about 20° C. and about 100° C. After the wet etching, facets may be formed in openings 36, which facets include (111) planes of substrate 20. In some exemplary embodiments, after the wet etching, depth D2 of opening 36 may be in a range between about 300 Å and about 800 Å, for example.

Figure 5:
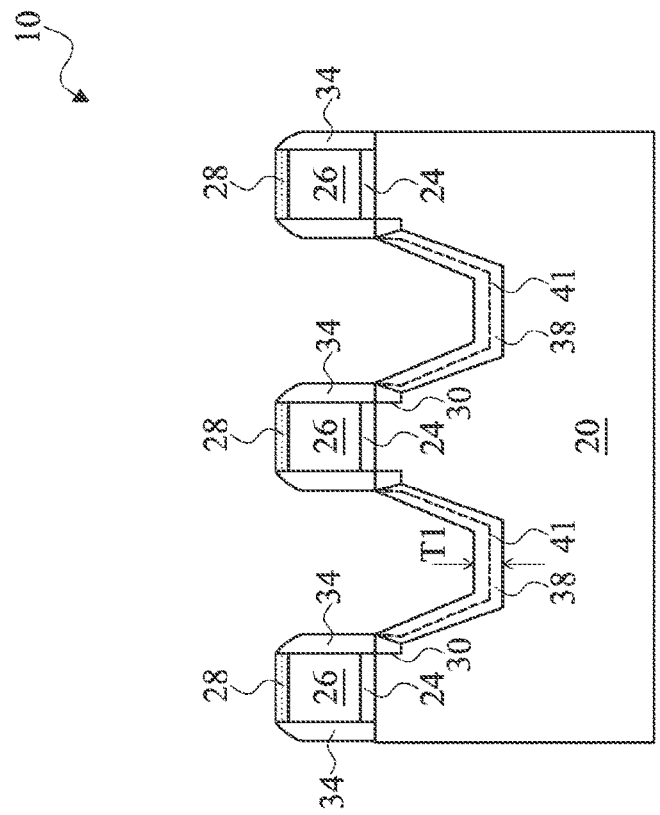

FIG. 5 illustrates the formation of epitaxy layers 38. Before the epitaxy, a pre-clean may be performed, for example, using an HF-based gas or a SiCoNi-based gas. The pre-clean may remove any undesirable silicon oxide that is formed as a result of the nature oxidation of the exposed surfaces in openings 36. In some embodiments, a high-temperature baking is performed. In alternative embodiments, the baking step is skipped. The high-temperature baking may be performed with or without the presence of HCl gas. The baking temperature may be in a range between about 700° C. and about 900° C. The pressure of baking may be in a range between about 10 Torr and about 200 Torr. The baking duration may be in a range between about 30 seconds and about 4 minutes, for example. The high-temperature baking may also remove the native oxide on the exposed surfaces of substrate 20, which exposed surfaces are in openings 36.

As shown in FIG. 5, a semiconductor material, such as silicon germanium (SiGe), is epitaxially grown in openings 36 through Selective Epitaxial Growth (SEG), forming epitaxy layers 38. Hence, throughout the description, epitaxy layers 38 are also referred to as SiGe layers 38. The process gases may include $H_2$, $N_2$, dichloro-silane (DCS), $SiH_4$, $GeH_4$, and/or the like. The temperature of the epitaxy may be in a range between about 600° C. and about 900° C. In some embodiments, an etching gas is added to promote the selective growth on the exposed surfaces of substrate 20, but not on dielectrics such as gate spacers 34 and hard masks 28. The pressure of the process gases may be in a range between about 10 Torr and about 200 Torr. The resulting thickness T1 of SiGe layers 38 may be in a range between about 100 Å and about 400 Å, for example.

During the epitaxy, desired p-type impurities may be doped while the growth proceeds. For example, when boron is to be doped, $B_2H_6$ may be included in the process gases. In some embodiments, the impurity concentration of p-type impurities such as boron in epitaxy layers 38 is lower than about $1E19/cm^3$. In other embodiments, the impurity concentration of p-type impurities may be in a range between about $1E18/cm^3$ and about $1E20/cm^3$. In alternative embodiments, during the epitaxy of layers 38, no p-type impurity is in-situ doped, or substantially no impurity (for example, with a p-type impurity concentration lower than about $10^{14}/cm^3$) is doped. Epitaxy layers 38 may have a first germanium atomic percentage in a range between about 10 percent and about 30 percent, for example, although different germanium percentages may also be used.

Figure 6:
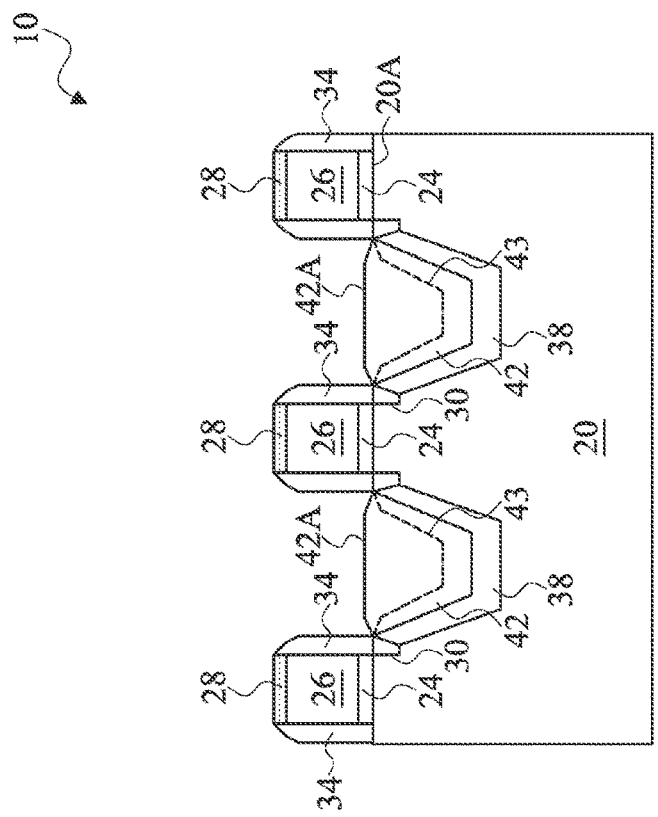

Referring to FIG. 6, epitaxy layers 42 are grown through an epitaxy. Epitaxy layers 42 may have a composition (the elements contained therein and the percentages of the elements) different from the composition of epitaxy layers 38. In some embodiments, epitaxy layers 42 are SiGe layers, which have a germanium atomic percentage higher than the germanium atomic percentage in epitaxy layers 38. For example, epitaxy layers 42 may have a second germanium atomic percentage in a range between about 30 percent and about 60 percent. The process conditions for forming epitaxy layers 42 may be similar to the process conditions for forming epitaxy layers 38, except that the ratios of silicon containing gases and germanium containing gases are adjusted. In some embodiments, the top surfaces 42A of epitaxy layers 42 are higher than the top surface 20A of substrate 20. Epitaxy layers 38 and 42 in combination form parts of the source or drain region (and also the source or drain stressor) of a MOS device, which also includes one of gate stacks 22 as its gate.

Furthermore, during the epitaxy, a p-type impurity may be in-situ doped with the proceeding of the epitaxy. The p-type impurity concentration C42 in epitaxy layers 42 may be higher than the p-type impurity concentration in epitaxy layers 38. For example, p-type impurity concentration C42 is in a range between about $1E20/cm^3$ and about $8E20/cm^3$. Furthermore, ratio C42/C38 may be greater than about 10 in accordance with some embodiments, wherein C42 and C38 are the p-type impurity concentrations (as in-situ doped without an additional thermal process) of layers 42 and 38, respectively.

Epitaxy layers 42 may also include a lower layer and an upper layer with different p-type impurity concentrations, wherein each of the lower layer and the upper layer has a substantially uniform in-situ doped p-type impurity concentration. FIG. 6 schematically illustrate dashed lines 43 to mark the interface between the upper and the lower layers of epitaxy layers 42. Furthermore, the germanium percentage C42A in the upper layer may be higher than the germanium percentage C42B in the lower layer. In some embodiments, p-type impurity concentration ratio C42A/C42B is greater than about 5 in some embodiments.

In some embodiments, in each of epitaxy layers 38 and 42, the germanium percentage is substantially uniform. In alternative embodiments, either one or both of epitaxy layers 38 and 42 has a gradually and continuously changed germanium percentage. During the respective epitaxy, the flow rate of the germanium-containing precursor (such as $GeH_4$) may be gradually and continuously changed. In these embodiments, in the layer in which the germanium percentage gradually changes, the lower portions of the layer have germanium percentages lower than the germanium percentages of the upper layers.

Figure 7:
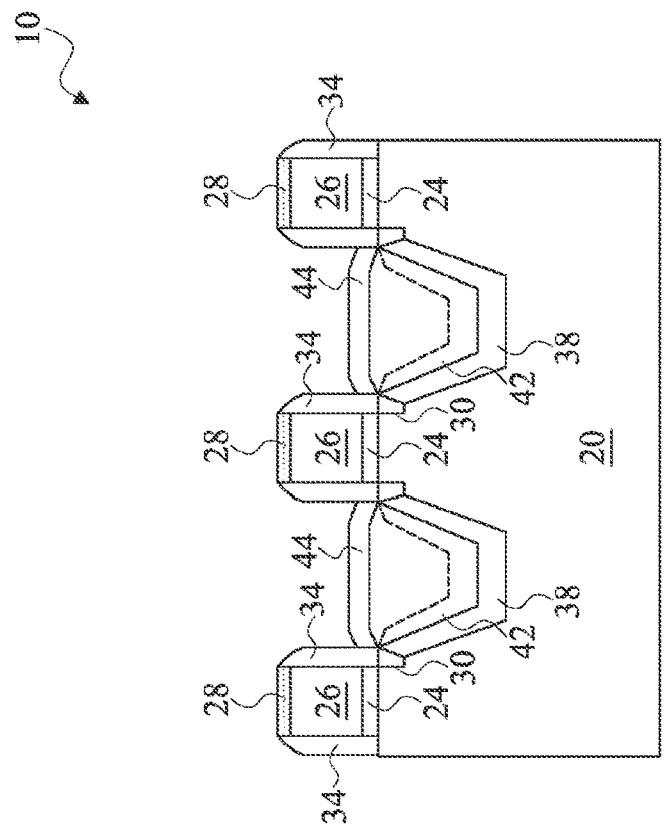

After the formation of epitaxy layers 42, capping layers 44 are formed through epitaxy, as shown in FIG. 7. Capping layers 44 may have a composition (including the elements contained therein and the percentages of the elements) different from the composition of epitaxy layers 42. Capping layers 44 may be pure silicon layers with no germanium comprised therein, or substantially pure silicon layers with, for example, less than 2 percent, or 1 percent, germanium. Accordingly, capping layers 44 are alternatively referred to as silicon caps throughout the description. Capping layers 44 may also be SiGe layers, with the germanium concentration in capping layers 44 lower than the germanium concentration in epitaxy layers 42.

During the epitaxy of capping layer 44, a p-type impurity such as boron may be in-situ doped with the proceeding of the epitaxy. In some embodiments, the concentration of the p-type impurity in capping layers 44 is higher than the p-type impurity concentration in epitaxy layers 42 and 38. Capping layer 44 may have the highest boron concentration in all portions of epitaxy layers 42 and 44 and/or the source/drain regions of the respective MOS device, which highest concentration may be higher than about $1E21/cm^3$ in some exemplary embodiments. A ratio of the p-type impurity concentration C44 in capping layers 44 to the p-type impurity concentration C42 in epitaxy layers 42 may be greater than about 5. Ratio C44/C42 (which may be as values as doped or the values after subsequent thermal processes) may also be in a range between about 5 and about 15. In some embodiments, p-type impurity concentration C44 is greater than about $1E21/cm^3$, and may be in a range between about $1E21/cm^3$ and about $8E21/cm^3$. The growth of epitaxy layers 38, 42, and 44 may be in-situ performed in a same chamber, with no vacuum break therein.

Figure 8:
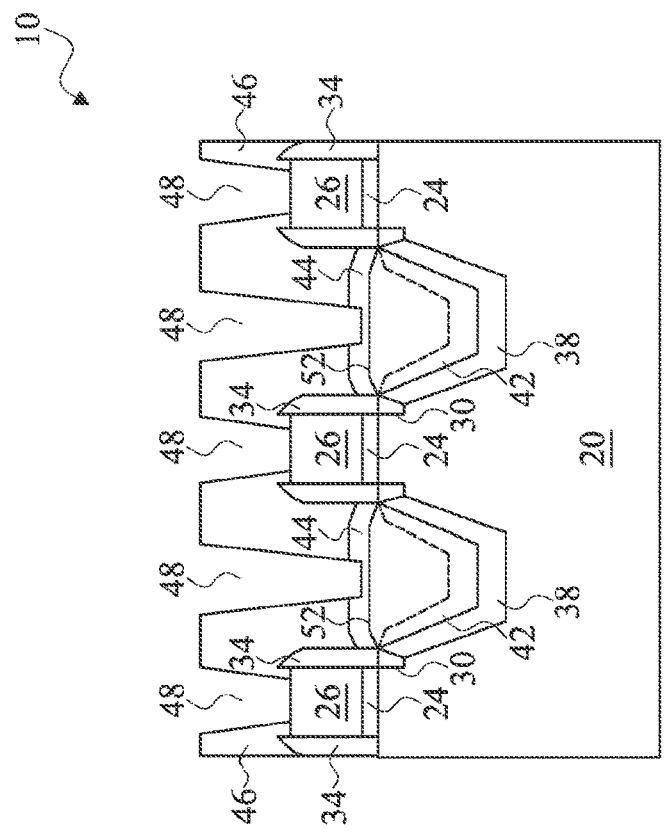

Next, hard masks 28 are removed, and the resulting structure is shown in FIG. 8. FIG. 8 also illustrates the formation of Inter-Layer Dielectric (ILD) 46, which is formed of a dielectric material such as Phospho-Silicate Glass (PSG), Boro-Silicate Glass (BSG), Boron-Doped Phospho-Silicate Glass (BPSG), or the like. A CMP may be performed to level the top surface of ILD 46. Next, contact openings 48 (including gate contact openings 48A and source/drain contact openings 48B) are formed, exposing underlying gate electrodes 26 and capping layers 44.

Figure 9:
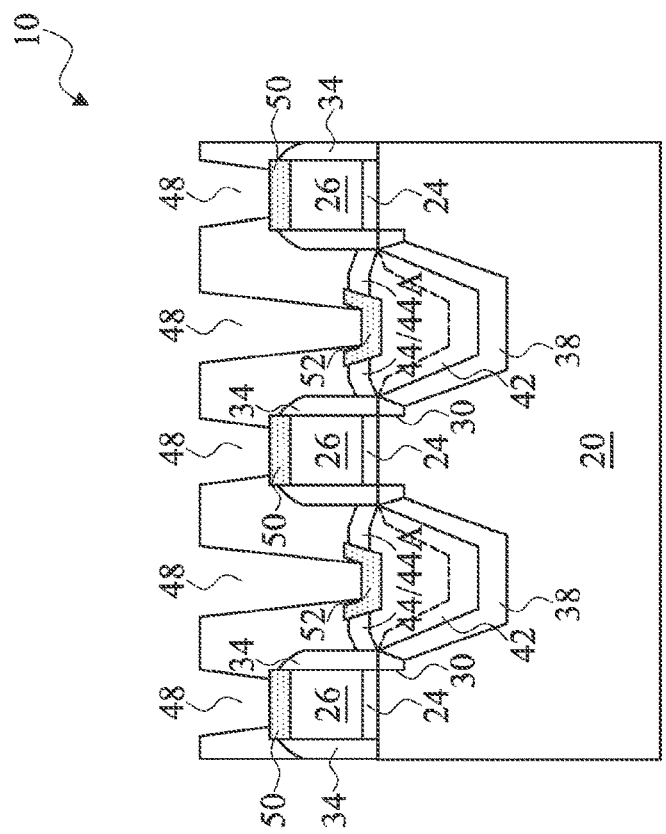

FIG. 9 illustrates the formation of gate silicide regions 50 and source/drain silicide regions 52. Silicide regions 50 and 52 may be formed by depositing a thin layer (not shown) of a silicide metal, such as titanium, cobalt, nickel, tungsten, or the like, over the devices, including the exposed surfaces of capping layers 44 and gate electrodes 26. Wafer 10 is then heated, which causes the silicide reaction to occur wherever the metal is in contact with silicon. After the reaction, a layer of metal silicide is formed between silicon and the metal. The un-reacted metal is selectively removed through the use of an etchant that attacks metal but does not attack silicide. As a result of the silicidation, source/drain silicide regions 52 extends into capping layers 44, and may extend into epitaxy layers 42. Alternatively, the top portions of capping layers 44 are silicided, and the bottom portions of capping layers 44 are not silicided. After silicidation, there may be some portions 44A of capping layers 44 remaining not silicided, wherein portions 44A is level with, and are on the opposite sides of, source/drain silicide regions 52.

Figure 10:
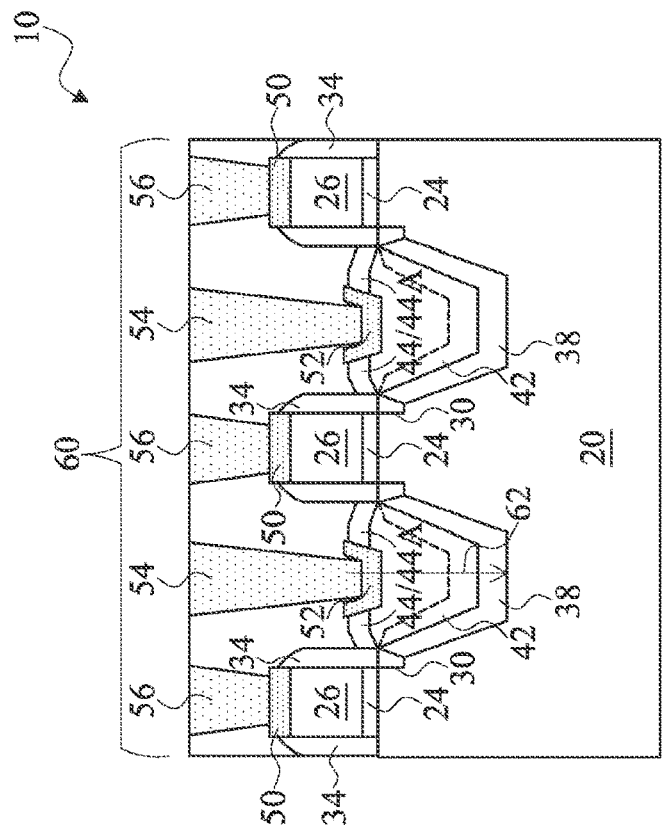

FIG. 10 illustrates the formation of source/drain contact plugs 54 and gate contact plugs 56, which are formed by filling a conductive material such as tungsten, copper, aluminum, titanium, cobalt, silicon, germanium, and/or the like, into openings 48, and performing a CMP to level the top surface of contact plugs 54 and 56 with the top surface of ILD 46. MOS transistor 60 is thus formed, which includes epitaxy layers 38, 42, and possibly remaining portions of capping layers 44 as the source and drain regions.

Figure 11:
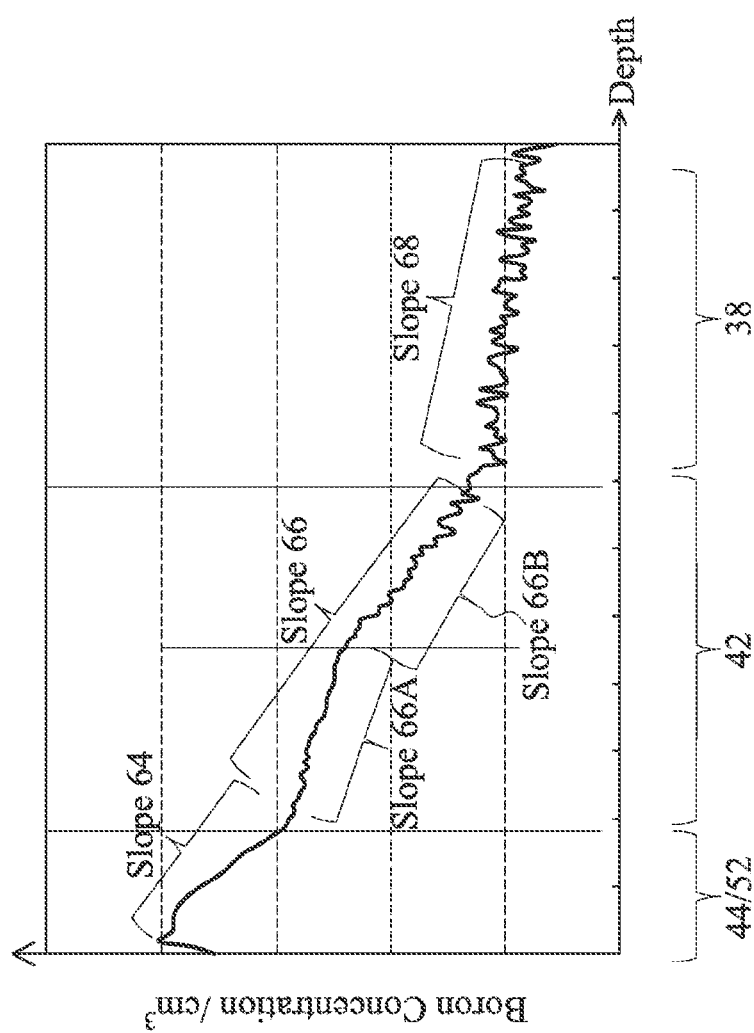
FIG. 11 schematically illustrates an exemplary profile of p-type impurities in the MOS device in accordance with some alternative exemplary embodiments.

FIG. 11 schematically illustrate the boron profile in the source and drain regions of MOS device 60, wherein the profile represents the boron concentration along the path of arrow 62 in FIG. 10. The boron concentration reflects the concentration caused by the diffusion of boron after subsequent thermal processes such as the formation of the overlying metal layers in interconnect structure. The respective regions 38, 42, 44, and 52 are also illustrated. The X-axis illustrates the depth measured starting from the top end of arrow 62. The Y-axis indicates the schematic concentration of boron. Since FIG. 11 is schematic, the values of the X-axis and the Y-axis are not marked. As shown in FIG. 11, the boron concentration is the highest at the top of layers/region 44 and 52. Epitaxy layer 42 has a boron concentration lower than that in silicon cap and silicide region 52. Epitaxy layer 38 has a boron concentration lower than that in epitaxy layer 42. Furthermore, the slopes of regions 38, 42, and 44/52 are shown as slopes 68, 66, and 64, respectively, wherein slope 64 is greater than slope 66, and slope 66 is greater than slope 68, wherein the difference in the slopes are caused by the diffusion of the in-situ doped p-type impurities.

In the embodiments of the present disclosure, with the p-type impurity concentration being higher in upper portions of the source/drain regions and lower in lower portions of the source/drain regions, the diffusion from the epitaxy regions to the underlying substrate is minimized. Hence, the Short Channel Effect (SCE) of the resulting MOS device is improved. In addition, with the top portion of the source/drain regions having increased p-type impurity concentrations, the resistance in the source/drain regions is reduced.

In accordance with some embodiments, an integrated circuit structure includes a semiconductor substrate, a gate stack over the semiconductor substrate, and a recess extending into the semiconductor substrate, wherein the recess is adjacent to the gate stack. A silicon germanium region is disposed in the recess, wherein the silicon germanium region has a first p-type impurity concentration. A silicon cap substantially free from germanium is overlying the silicon germanium region. The silicon cap has a second p-type impurity concentration greater than the first p-type impurity concentration.

In accordance with other embodiments, an integrated circuit structure includes a semiconductor substrate, and a gate stack over the semiconductor substrate. The gate stack is comprised in a MOS device. A source/drain region of the MOS device extends into the semiconductor substrate. The source/drain region includes a first silicon germanium region, and a second silicon germanium region over the first silicon germanium region. The first silicon germanium region has a first germanium percentage, and the second silicon germanium region has a second germanium percentage greater than the first germanium percentage. A silicon cap is overlying and contacting the second silicon germanium region. The silicon cap has a highest p-type impurity concentration among the source/drain region.

In accordance with yet other embodiments, a method includes forming a gate stack over a semiconductor substrate, and forming an opening extending into the semiconductor substrate. The opening is on a side of the gate stack. The method further includes performing a first epitaxy to grow a first silicon germanium region in the opening, wherein during the first epitaxy, the first silicon germanium region is in-situ doped to a first p-type impurity concentration. A second epitaxy is then performed to grow a silicon cap substantially free from germanium over the first silicon germanium region. During the second epitaxy, the silicon cap is in-situ doped to a second p-type impurity concentration higher than the first p-type impurity concentration.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
   a semiconductor substrate;
   a gate stack over the semiconductor substrate;
   a recess extending into the semiconductor substrate, wherein the recess is adjacent to the gate stack;
   a silicon germanium region in the recess, wherein the silicon germanium region has a first p-type impurity concentration; and
   a silicon cap substantially free from germanium over the silicon germanium region, wherein the silicon cap has a second p-type impurity concentration greater than the first p-type impurity concentration.

2. The integrated circuit structure of claim 1, wherein a portion of the silicon germanium region is in contact with the silicon cap, and the portion of the silicon germanium region has a highest p-type impurity concentration among all source and drain regions of a Metal-oxide-Semiconductor (MOS) device that comprises the silicon germanium region and the silicon cap.

3. The integrated circuit structure of claim 1 further comprising forming a silicide region extending into the silicon cap, with the silicon cap comprising a remaining portion on a side of the silicide region.

4. The integrated circuit structure of claim 3, wherein the silicide region has a third p-type impurity concentration higher than the first p-type impurity concentration.

5. The integrated circuit structure of claim 1 further comprising a silicide region extending into the silicon cap and the silicon germanium region.

6. The integrated circuit structure of claim 1, wherein from a top of the silicon cap to a bottom of the silicon germanium region, p-type impurity concentrations gradually reduce.

7. The integrated circuit structure of claim 1, wherein the silicon germanium region further comprises an upper portion and a lower portion, and wherein a p-type impurity concentration in the upper portion is higher than a p-type impurity concentration in the lower portion.

8. An integrated circuit structure comprising:
   a semiconductor substrate;
   a gate stack over the semiconductor substrate, wherein the gate stack is a part of a Metal-Oxide-Semiconductor (MOS) device;
   a source/drain region of the MOS device extending into the semiconductor substrate, wherein the source/drain region comprises:
      a first silicon germanium region, wherein the first silicon germanium region has a first germanium percentage; and
      a second silicon germanium region over the first silicon germanium region, wherein the second silicon germanium region has a second germanium percentage greater than the first germanium percentage; and
   a silicon cap over and contacting the second silicon germanium region, wherein the silicon cap has a p-type impurity concentration being highest among all p-type impurity concentrations in the source/drain region.

9. The integrated circuit structure of claim 8, wherein the highest p-type impurity concentration is higher than about $1E21/cm^3$.

10. The integrated circuit structure of claim 8, wherein the silicon cap is substantially free from germanium.

11. The integrated circuit structure of claim 8, wherein the silicon cap comprises germanium and has a third germanium percentage lower than the second germanium percentage.

12. The integrated circuit structure of claim 8 further comprising forming a silicide region extending into the silicon cap, with the silicon cap comprising a remaining portion on a side of the silicide region.

13. The integrated circuit structure of claim 12, wherein the silicide region has a p-type impurity concentration higher than a p-type impurity concentration of the second silicon germanium region.

14. The integrated circuit structure of claim 8, wherein the p-type impurity concentration of the second silicon germanium region is further higher than a p-type impurity concentration of the first silicon germanium region.

15. An integrated circuit structure comprising:
   a silicon substrate;
   a gate stack of a transistor over the silicon substrate;
   a source/drain region of the transistor extending into the silicon substrate, wherein the source/drain region comprises:
      a silicon germanium region having a bottom surface in contact with the silicon substrate to form a first interface, wherein the silicon germanium region is of p-type; and
   a silicon cap over and contacting the silicon germanium region, wherein the silicon cap is of p-type, and wherein in a vertical direction from the first interface to close to a top surface of the silicon cap, p-type impurity concentrates in corresponding portions of the silicon germanium region increase gradually.

16. The integrated circuit structure of claim 15, wherein the silicon germanium region comprises:
   a first sub-region having a first germanium percentage; and
   a second sub-region over the first sub-region, wherein the second sub-region has a second germanium percentage higher than the first germanium percentage.

17. The integrated circuit structure of claim 15, wherein the silicon cap has a bottom higher than a second interface between the silicon substrate and the gate stack.

18. The integrated circuit structure of claim 15, wherein the first interface is formed between the lowest portion of the silicon germanium region and a respective underlying portion of the silicon substrate.

19. The integrated circuit structure of claim 15 further comprising a silicide region extending into the silicon cap, wherein the silicide region has a p-type impurity concentration higher than the p-type impurity concentration of the silicon germanium region.

20. The integrated circuit structure of claim 19, wherein the silicide region penetrates through the silicon cap, and extends into the silicon germanium region.

* * * * *